US011190882B2

(12) United States Patent
Zhu et al.

(10) Patent No.: US 11,190,882 B2
(45) Date of Patent: Nov. 30, 2021

(54) TERMINAL DEVICE

(71) Applicant: BEIJING XIAOMI MOBILE SOFTWARE CO., LTD., Beijing (CN)

(72) Inventors: Shoujing Zhu, Beijing (CN); Diyun Xiang, Beijing (CN); Pengfei Zhang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/928,966

(22) Filed: Jul. 14, 2020

(65) Prior Publication Data

US 2021/0266676 A1 Aug. 26, 2021

(30) Foreign Application Priority Data

Feb. 20, 2020 (CN) .......................... 202010104755.1

(51) Int. Cl.
*H04R 1/02* (2006.01)
*H04R 17/00* (2006.01)
*H05K 5/00* (2006.01)
*H05K 5/02* (2006.01)

(52) U.S. Cl.
CPC ............ *H04R 17/00* (2013.01); *H04R 1/028* (2013.01); *H05K 5/0017* (2013.01); *H05K 5/0217* (2013.01); *H04R 2400/11* (2013.01); *H04R 2499/11* (2013.01); *H04R 2499/15* (2013.01)

(58) Field of Classification Search
CPC ...................................................... H04R 1/02
See application file for complete search history.

(56) References Cited

U.S. PATENT DOCUMENTS

| 5,245,245 A * | 9/1993 | Goldenberg .......... H01L 41/094 |
| | | 310/312 |
| 5,801,475 A * | 9/1998 | Kimura .................. G01P 13/00 |
| | | 310/319 |
| 9,747,762 B1 * | 8/2017 | Wang ....................... G08B 6/00 |
| 10,904,651 B2 * | 1/2021 | Kim ........................ H04R 17/00 |
| 2005/0232573 A1 * | 10/2005 | Iwauchi ............... G02B 6/0033 |
| | | 385/147 |
| 2007/0080951 A1 | 4/2007 | Maruyama et al. |

(Continued)

FOREIGN PATENT DOCUMENTS

| EP | 1345391 A1 | 9/2003 |
| EP | 1544720 A1 | 6/2005 |

(Continued)

OTHER PUBLICATIONS

Extended European Search Report in the European Application No. 20187086.2, dated Jan. 28, 2021, (8p).

*Primary Examiner* — Olisa Anwah

(74) *Attorney, Agent, or Firm* — Arch & Lake LLP

(57) ABSTRACT

Provided is a terminal device. The terminal device includes: a housing; a display screen installed on the housing; a piezoelectric body parallel to the display screen and including a fixed end and a free end, the fixed end being fixed on the housing, and the free end being opposite to the fixed end and being configured to vibrate under driving of an audio signal; and a vibrating body arranged between the display screen and the piezoelectric body, fixedly connected with the free end, and configured to vibrate in a direction perpendicular to the display screen with the vibration of the free end.

19 Claims, 3 Drawing Sheets

(56) References Cited

U.S. PATENT DOCUMENTS

| | | | |
|---|---|---|---|
| 2007/0089515 A1* | 4/2007 | Shih | G01N 29/022 |
| | | | 73/579 |
| 2015/0270476 A1* | 9/2015 | Kim | H01L 41/1876 |
| | | | 310/334 |
| 2016/0023245 A1 | 1/2016 | Zadesky et al. | |
| 2016/0170539 A1* | 6/2016 | Watanabe | H04R 17/00 |
| | | | 345/173 |
| 2017/0203333 A1* | 7/2017 | Takahashi | H01L 41/0471 |
| 2017/0311086 A1 | 10/2017 | Ishii et al. | |
| 2018/0120938 A1* | 5/2018 | Frescas | H01L 27/20 |
| 2019/0189904 A1* | 6/2019 | Benedict | H01L 41/0477 |
| 2019/0273992 A1* | 9/2019 | Harris | H04R 3/12 |
| 2020/0059544 A1 | 2/2020 | Hwang et al. | |
| 2020/0215574 A1 | 7/2020 | Zadesky et al. | |
| 2021/0051412 A1* | 2/2021 | Kim | H04R 1/028 |

FOREIGN PATENT DOCUMENTS

| | | | |
|---|---|---|---|
| EP | 3567833 A1 | 11/2019 | |
| WO | 2014164018 A1 | 10/2014 | |

\* cited by examiner

TERMINAL DEVICE

CROSS-REFERENCE TO RELATED APPLICATION

This application is based upon and claims priority to Chinese Patent Application No. 202010104755.1, filed Feb. 20, 2020, the entire contents of which are incorporated herein by reference for all purposes.

TECHNICAL FIELD

The disclosure relates to the field of electronic devices, and particularly relates to a terminal device with audio signal output vibration.

BACKGROUND

With development of terminal devices, terminal devices such as mobile phones have more varieties of functions. Especially, the function of audio modules in mobile phones to output audio signals has brought convenient communication and acoustic enjoyment to people's daily life. Mobile phones typically use a sound production hole or a display screen to output an audio signal. However, if a sound production hole is used, the hole needs to be formed in a housing, and thus water or dust may come into the hole. Existence of a hole does not conform to the non-porous design trend of terminal devices either. If a traditional manner of driving a display screen for sound production is used, that is, the display screen is driven to vibrate by driving a middle frame to vibrate, poor vibration effect and poor sound quality may be caused.

SUMMARY

According to a first aspect of the present disclosure, a terminal device is provided. The terminal device includes: a housing; a display screen disposed on the housing; a piezoelectric body, parallel to the display screen and comprising a fixed end and a free end, wherein the fixed end is fixedly connected to the housing, and the free end is opposite to the fixed end and is configured to vibrate under driving of an audio signal; and a vibrating body, disposed between the display screen and the piezoelectric body, fixedly connected with the free end, and configured to vibrate in a direction perpendicular to the display screen with vibration of the free end.

According to a second aspect of the present disclosure, an audio output device is provided. The audio output device includes: a middle frame; a panel disposed on the middle frame; a piezoelectric body, parallel to the panel and comprising a fixed end and a free end, wherein the fixed end is fixedly connected to the middle frame, and the free end is opposite to the fixed end and is configured to vibrate under driving of an audio signal; and a vibrating body, disposed between the panel and the piezoelectric body, fixedly connected with the free end, and configured to vibrate in a direction perpendicular to the panel with vibration of the free end.

It is to be understood that the above general description and the following detailed description are exemplary and explanatory only, and are not intended to limit the disclosure.

BRIEF DESCRIPTION OF THE DRAWINGS

The accompanying drawings, which are incorporated in and constitute a part of this specification, illustrate examples consistent with the disclosure and together with the description serve to explain the principles of the disclosure.

DETAILED DESCRIPTION

Examples of the present disclosure will be described in detail herein, some of which are illustrated in the accompanying drawings. When the following description refers to the accompanying drawings, the same numbers in different drawings represent the same or similar elements unless otherwise indicated. The implementation models described in the following examples do not represent all implementation models consistent with the disclosure. On the contrary, they are merely examples of devices and methods consistent with some aspects of the disclosure as detailed in the appended claims.

Terms used in the present disclosure are only adopted for the purpose of describing specific examples but not intended to limit the present disclosure. "A/an" and "the" in a singular form in the present disclosure and the appended claims are also intended to include a plural form, unless other meanings are clearly denoted throughout the present disclosure. It is also to be understood that term "and/or" used in the present disclosure refers to and includes one or any or all possible combinations of multiple associated items that are listed.

It is to be understood that "first", "second" and similar terms used in the specification and claims of the present application are not to represent any sequence, number or importance but only to distinguish different parts. Unless otherwise pointed out, terms like "front", "rear", "lower" and/or "upper" are only for convenient description but not limited to a position or a spatial orientation. Terms like "include" or "contain" refer to that an element or object appearing before "include" or "contain" covers an element or object and equivalent thereof listed after "include" or "contain" and does not exclude another element or object. Similar terms such as "connect" or "interconnect" are not limited to physical or mechanical connection, and may include electrical connection, either direct or indirect.

Figure 1:
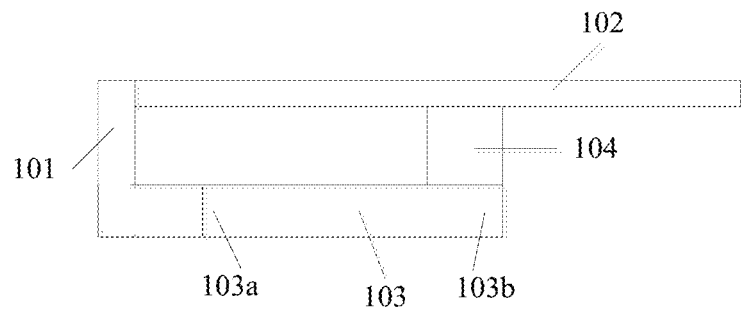
FIG. 1 is a first schematic diagram of a terminal device according to an example of the present disclosure.

FIG. 1 is a first schematic structural diagram of a terminal device according to an example of the present disclosure. As shown in FIG. 1, the terminal device at least includes: a housing 101; a panel such as a display screen 102, installed on the housing; a piezoelectric body 103, parallel to the display screen 102 and including a fixed end and a free end; the fixed end 103a may be fixed on the housing 101, and the free end 103b may be opposite to the fixed end 103a and may be configured to vibrate under driving of an audio signal; and a vibrating body 104, arranged between the display screen 102 and the piezoelectric body 103, fixedly connected with the free end 103b, and configured to vibrate in a direction perpendicular to the display screen with the vibration of the free end.

The terminal device may be a wearable electronic device or a mobile terminal. The mobile terminal may include a mobile phone, a notebook computer and a tablet computer. The wearable electronic device may include a smart watch. There is no limit in the examples of the disclosure. In FIG. 1, the terminal device may be an audio-output device.

The display screen is configured to display information. The display screen includes, but is not limited to, a liquid crystal display (LCD) or an organic light-emitting diode (OLED). No limits are made in the examples of the disclosure.

In the examples of the disclosure, the display screen may be installed on one surface of the housing or may be installed on different surfaces of the housing. For example, when the terminal device is a mobile phone, the mobile phone may be a single-screen mobile phone or a dual-screen mobile phone. There is no limit in the examples of the disclosure.

The piezoelectric body 103 may be parallel to the display screen 102. When the display screen is installed on one surface of the housing, one piezoelectric body may be provided and is parallel to the display screen on the surface. When the display screen is installed on different surfaces of the housing, at least two piezoelectric bodies may be provided and are respectively parallel to the display screen on different surfaces. For example, when the display screen is installed on both a first surface of the housing and a second surface opposite to the first surface, two piezoelectric bodies may be provided and are respectively parallel to the first surface and the second surface.

Figure 2:
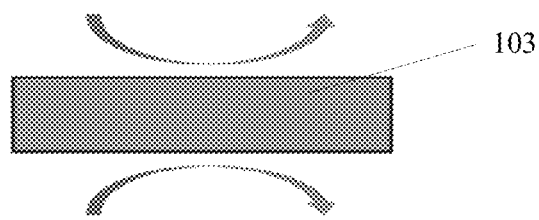
FIG. 2 is a schematic diagram of vibration directions of a piezoelectric body according to an example of the present disclosure.

In some examples of the disclosure, the piezoelectric body is an energy conversion device for converting electric energy to mechanical energy. The piezoelectric body may include a fixed end 103a and a free end 103b. The fixed end may be an end which is fixed in the housing and remains stationary. The free end may be opposite to the fixed end, and the free end may be an end which vibrates based on driving of an audio signal. As shown in FIG. 2, in the examples of the disclosure, the free end of the piezoelectric body 103 may be deformed in two opposite directions respectively under driving of an audio signal, thereby generating vibration. Therefore, compared with vibration of two ends of a traditional piezoelectric body under driving of an audio signal, the vibration amplitude of the free end of the piezoelectric body according to some examples of the disclosure is greater than the vibration amplitude of the traditional piezoelectric body, thereby increasing the vibration amplitude.

Exemplarily, the piezoelectric body may be made of a ceramic material.

In the examples of the disclosure, the vibrating body may be arranged between the display screen and the piezoelectric body. The number of vibrating bodies in the terminal device may be set according to the number of piezoelectric bodies. For example, when one piezoelectric body is arranged in the terminal device, one vibrating body may be provided. When two piezoelectric bodies are arranged in the terminal device, two vibrating bodies may be provided. The number of vibrating bodies in the terminal device is not limited in the examples of the disclosure.

In some examples of the disclosure, the free end of the piezoelectric body is fixedly connected with the vibrating body, and the vibrating body is fixedly connected with the display screen. When the free end vibrates based on an audio signal, the free end may drive the vibrating body to vibrate in a direction perpendicular to the display screen, so that the display screen can be driven by the vibrating body to vibrate in a direction perpendicular to the display screen, so as to realize vibratory sound production of the display screen.

In other words, the free end of the piezoelectric body may drive the display screen to vibrate in a direction perpendicular to the display screen through the vibrating body, instead of driving the display screen to vibrate due to bending of two ends of the piezoelectric body. Therefore, on one hand, in the examples of the disclosure, the vibrating body may convert vibration of the piezoelectric body due to bending to vertical vibration in a direction perpendicular to the display screen, thereby reducing audio signal distortion caused by a contact surface between the vibrating body and the display screen in different vibrations, and improving the sound quality effect of output audio signals. On the other hand, in the examples of the disclosure, the fixed end is fixed on the housing, and the free end may drive the display screen to vibrate, thereby increasing the vibration amplitude of the free end relative to the fixed end, and improving the volume effect of the output audio signals. In addition, in the examples of the disclosure, the display screen is no longer driven by the middle frame to vibrate, thereby reducing consumption of mechanical energy generated by the middle frame and other devices connected to the middle frame for deformation of the piezoelectric body, and improving the sound quality effect.

Figure 3:
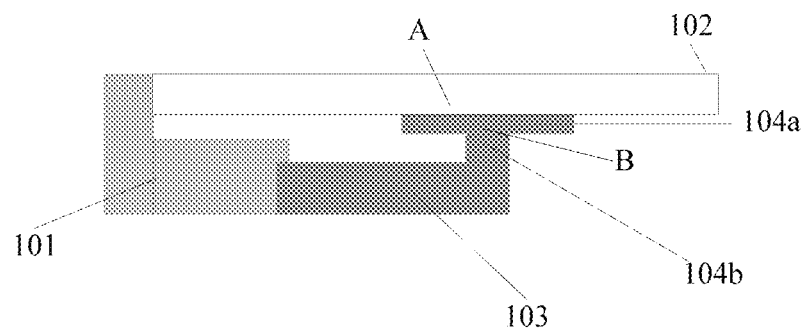
FIG. 3 is a second schematic diagram of a terminal device according to an example of the present disclosure.

In some examples, as shown in FIG. 3, the vibrating body may include: a first vibrating element 104a, arranged between the display screen 102 and the piezoelectric body 103 and fixedly connected with the display screen 102; and a second vibrating element 104b, arranged between the first vibrating element 104a and the piezoelectric body 103 and fixedly connected with the first vibrating element 104a and the free end respectively. The second vibrating element 104b is configured to convert the vibration of the free end to a second vibration in a direction perpendicular to the display screen. The first vibrating element 104a is configured to conduct the second vibration in the direction perpendicular to the display screen, conducted by the second vibrating element 104b, to the display screen. In other words, the first vibrating element 104a is configured to conduct the second vibration from the second vibrating element 104b to the display screen.

In other words, in some examples of the disclosure, the vibration of the free end may be converted to the vibration in a direction perpendicular to the display screen through the second vibrating element, and then, the vibration in a direction perpendicular to the display screen may be conducted to the display screen through the first vibrating element, so that the display screen may vibrate in a direction perpendicular to the display screen, so as to realize vibratory sound production of the display screen.

In this way, compared with driving the display screen to vibrate through bending of two ends of a traditional piezoelectric body, in some examples of the disclosure, the display screen may vibrate in a direction perpendicular to the display screen, thereby reducing audio signal distortion, and improving the sound quality effect of output audio signals. Furthermore, in the examples of the disclosure, the fixed end is fixed on the housing, and the free end may vibrate under driving of an audio signal, thereby increasing the vibration amplitude of the free end relative to the fixed end, and further improving the volume effect of the output audio signals.

In the examples of the disclosure, the first vibrating element may be fixedly connected with the display screen through a first bonding body. The second vibrating element may be fixedly connected with the first vibrating element and the free end respectively through a second bonding body.

In some examples, the housing may further include a middle frame and a third bonding body arranged between the middle frame and the housing. The third bonding body may be coated on the edge of the display screen and is configured to attach the display screen to the middle frame so as to fix the display screen.

It is to be noted that the first bonding body, the second bonding body and the third bonding body may be the same bonding body or may be different bonding bodies, which are not limited in the examples of the disclosure. Exemplarily, the first bonding body, the second bonding body and the third bonding body may be gel.

In some examples, the first vibrating element may be close to the center of the display screen. It is to be noted that the situation that the first vibrating element is close to the center of the display screen may include: a distance between the first vibrating element and the center of the display screen is less than a first distance threshold. The first distance threshold may be set according to the distance between the center of the display screen and an edge of the display screen. For example, the first distance threshold may be less than the distance between the center of the display screen and the edge of the display screen. In some other examples, the first vibrating element may be arranged in a center region of the display screen.

Exemplarily, when the center of the display screen is position A, the first vibrating element may be arranged at the position A.

It is to be noted that compared with the situation that the first vibrating element is arranged at a side frame of the housing, in the examples of the disclosure, the first vibrating element may be arranged at a position where the distance between the first vibrating element and the center of the display screen is less than the first distance threshold, or the first vibrating element may be directly arranged in a center region of the display screen, so as to reduce weakened vibration or non-vibration of a part of the display screen close to the side frame due to the fact that the display screen is close to the side frame, so that the display screen can better vibrate.

In some examples, the second vibrating element may be close to the center of the first vibrating element. It is to be noted that the situation that the second vibrating element is close to the center of the first vibrating element may include: a distance between the second vibrating element and the center of the first vibrating element is less than a second distance threshold. The second distance threshold may be set according to the distance between the center of the first vibrating element and the edge of the first vibrating element. For example, the second distance threshold may be less than the distance between the center position of the first vibrating element and the edge of the first vibrating element.

In some other examples, the second vibrating element may also be arranged in a center region of the first vibrating element.

Exemplarily, when the center of the first vibrating element is position B, the second vibrating element may be arranged at the position B.

In some examples of the disclosure, the second vibrating element can not only convert vibration of the free end to vibration in a direction perpendicular to the display screen, but also conduct the vibration in a direction perpendicular to the display screen to the first vibrating element.

It is to be noted that compared with the situation that the second vibrating element is arranged at an edge of the first vibrating element, in the examples of the disclosure, the second vibrating element may be arranged at a position where the distance between the second vibrating element and the center of the first vibrating element is less than the second distance threshold, or the second vibrating element may be directly arranged in a center region of the first vibrating element, so that the second vibrating element may better conduct vibration to the first vibrating element, and then, the first vibrating element may better conduct the vibration to the display screen.

In some examples, as shown in FIG. 3, the cross-sectional area of the first vibrating element 104a may be greater than the cross-sectional area of the second vibrating element 104b.

In other words, the projection area of the first vibrating element projected on the display screen may be greater than the projection area of the second vibrating element projected on the display screen. In this way, compared with conducting vibration to the display screen directly through the second vibrating element, in the examples of the disclosure, the vibration may be conducted to the display screen through the first vibrating element to increase the vibration area of the display screen, so that a larger region of the display screen may be vibrated.

In some examples, as shown in FIG. 3, the cross-sectional area of the first vibrating element 104a may be less than the display area of the display screen 102.

Exemplarily, the cross-sectional area of the first vibrating element may be set to be equal to or less than a half of the display area of the display screen. There is no limit in the examples of the disclosure.

It is to be noted that under the condition that the layout requirements of other devices of the terminal device are met, the area of the first vibrating element may be increased. Therefore, the vibration area of the display screen may be increased to a maximum limit.

In some examples, both the first vibrating element and the second vibrating element are composed of a hard material with a Young's modulus greater than a preset Young's modulus.

Exemplarily, the preset Young's modulus may be set according to actual situations. For example, the preset Young's modulus may be 0.5 G Pa or 10 G Pa.

The hard material may include a metal material, an alloy material or a glass fiber material. There is no limit in the examples of the disclosure.

In some examples, the first vibrating element may be of a sheet-shaped structure, and the second vibrating element may be of a cylinder-shaped structure.

It is to be noted that the cylinder-shaped structure includes, but is not limited to, a circular cylinder-shaped structure and a square cylinder-shaped structure.

In some examples of the disclosure, the first vibrating element may be of a sheet-shaped structure, thereby reducing the thickness increase of the terminal device due to additional arrangement of the first vibrating element on the terminal device, and increasing the utilization ratio of the space in the terminal device.

In some other examples, the first vibrating element may include sheet steel.

In some other examples, the thickness of the first vibrating element may be between 0.1 mm and 0.3 mm.

Figure 4:
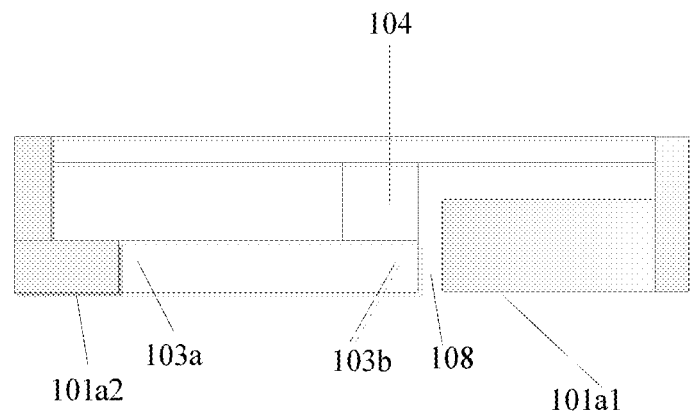
FIG. 4 is a third schematic diagram of a terminal device according to an example of the present disclosure.

In some examples, as shown in FIG. 4, the housing may include a middle frame 101a. The middle frame 101a at least include two parts, namely the middle frame 101a1 and the middle frame 101a2.

There may be a gap 108 between the free end 103b and the middle frame 101a1; and the fixed end 103a may be fixed on the middle frame 101a2.

It is to be noted that the gap 108 between the free end 103b and the middle frame 101a1 may be between 0.1 mm and 0.5 mm. The fixed end 103a may be fixed on the middle frame 101a2 through screws, welding, rivets or other fixing elements, and may also be fixed on the middle frame 101a2 by being arranged in the groove of the middle frame 101a2. There is no limit in the examples of the disclosure.

In the examples of the disclosure, the fixed end 103a may be fixed on the middle frame 101a2, and there may be a gap between the free end 103b and the middle frame 101a1. When the free end vibrates, the free end may not drive the middle frame to vibrate, the middle frame may not inhibit the vibration of the free end either. In this way, the mechanical energy generated by the vibration of the free end can be conducted to the second vibrating element to a maximum limit and then conducted to the display screen.

Figure 5:
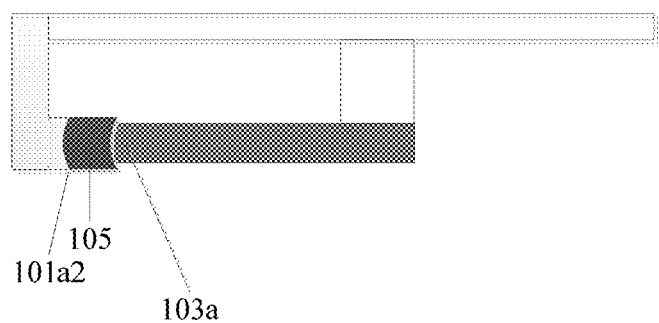
FIG. 5 is a fourth schematic diagram of a terminal device according to an example of the present disclosure.

In some examples, as shown in FIG. 5, the middle frame 101a2 is provided with a groove 105, the opening direction of the groove 105 is parallel to the installation direction of the display screen, and the fixed end 103a is arranged in the groove 105.

In the examples of the disclosure, the internal space of the terminal device occupied by the piezoelectric body can be reduced by disposing the fixed end in the groove, and the space utilization ratio of the terminal device is thus increased.

In some examples, as shown in FIG. 4, the housing may include a middle frame 101a.

There may be a gap between the vibrating body 104 and the middle frame 101a1.

Exemplarily, the gap between the vibrating body 104 and the middle frame 101a1 may be between 0.1 mm and 0.5 mm.

In the examples of the disclosure, the vibrating body is configured to conduct the vibration of the free end of the piezoelectric body to the display screen. When the position between the middle frame and the vibrating body is set, it is needed to provide a gap between the vibrating body and the middle frame. In this way, the vibrating body can conduct the mechanical energy of the free end to the display screen to a maximum extent.

It is to be noted that the vibrating body may include the second vibrating element and the first vibrating element on the second vibrating element, and the area of the first vibrating element may be different from the area of the second vibrating element. In some examples, the middle frame may be provided with a vibrating groove configured to accommodate the vibrating body, and the cross-sectional area of the vibrating groove at the first vibrating element may be greater than the cross-sectional area of the vibrating groove at the second vibrating element. Therefore, the space occupied by the vibrating body in the terminal device can be reduced to the maximum limit, and the space utilization ratio of the terminal device is increased.

Exemplarily, the cross-sectional area of the vibrating groove at the first vibrating element may be set according to the cross-sectional area of the first vibrating element and the cross-sectional area of the second vibrating element. For example, the cross-sectional area of the vibrating groove at the first vibrating element may be greater than both the cross-sectional area of the first vibrating element and the cross-sectional area of the vibrating groove at the second vibrating element.

The cross-sectional area of the vibrating groove at the second vibrating element may be set according to the cross-sectional area of the second vibrating element and the cross-sectional area of the first vibrating element. For example, the cross-sectional area of the vibrating groove at the second vibrating element may be greater than the cross-sectional area of the second vibrating element and less than the cross-sectional area of the vibrating groove at the first vibrating element.

It is to be noted that the "first" and "second" in the examples of the disclosure are only for convenience of expression and distinction, and have no other specific meanings.

Figure 6:
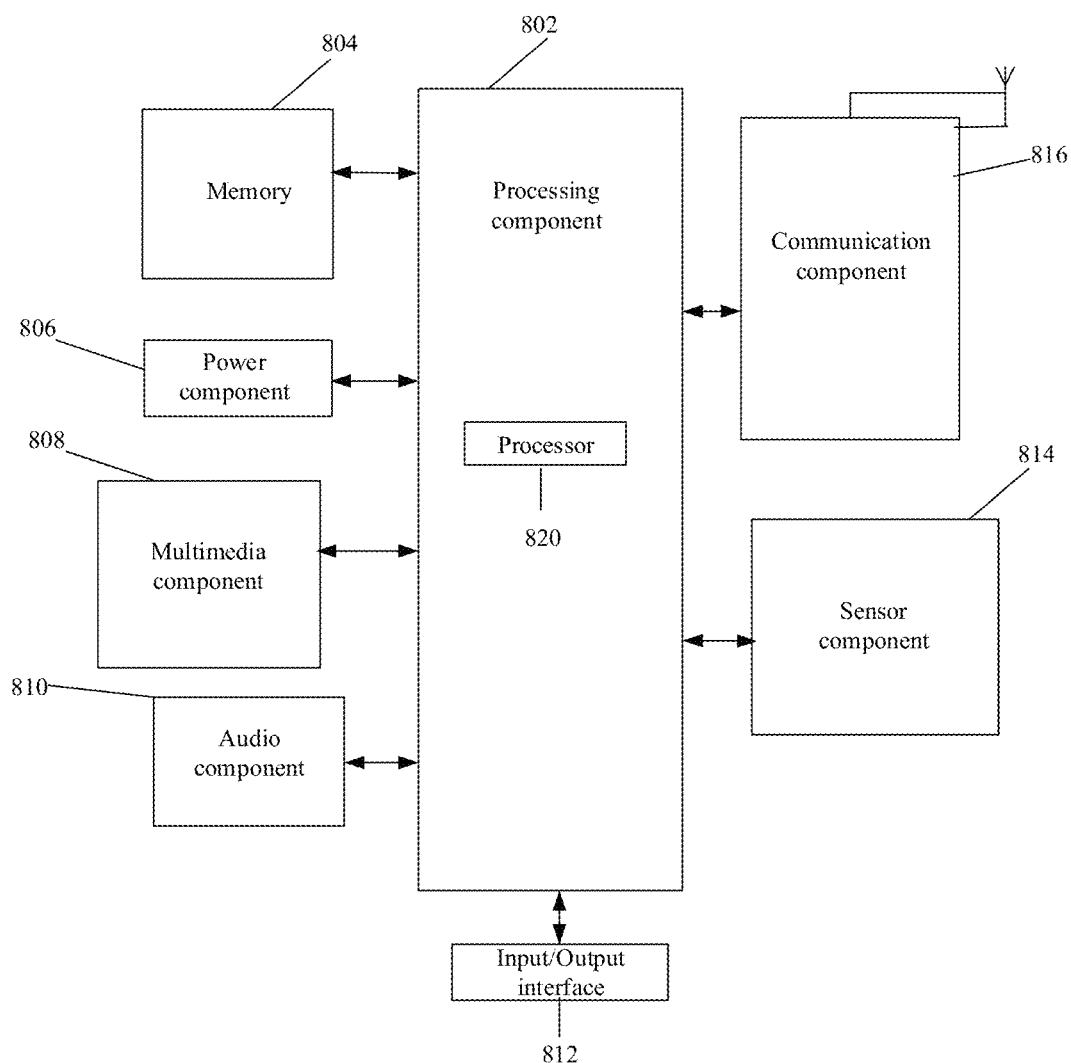
FIG. 6 is a block diagram of a terminal device according to an example of the present disclosure.

FIG. 6 is a block diagram of a terminal device according to an example of the present disclosure. The terminal device may be a mobile phone, a computer, a digital broadcast terminal, a messaging device, a gaming console, a tablet device, a medical device, exercise equipment, a personal digital assistant, and the like.

Referring to FIG. 6, the terminal device may include one or more of the following components: a processing component 802, a memory 804, a power component 806, a multimedia component 808, an audio component 810, an Input/Output (I/O) interface 812, a sensor component 814, and a communication component 816.

The processing component 802 typically controls overall operations of the terminal device, such as operations associated with display, telephone calls, data communications, camera operations, and recording operations. The processing component 802 may include one or a plurality of processors 820 to execute instructions to complete all or part of the steps of the method described above. In addition, the processing component 802 may include one or a plurality of modules to facilitate the interaction between the processing component 802 and other components. For example, the processing component 802 may include a multimedia module to facilitate the interaction between the multimedia component 808 and the processing component 802.

The memory 804 is configured to store various types of data to support the operation of the terminal device. Examples of such data include instructions for any applications or methods operated on the terminal device, contact data, phonebook data, messages, pictures, videos, etc. The memory 804 may be implemented by any type of volatile or non-volatile memory devices or combinations thereof, such as a Static Random Access Memory (SRAM), an Electrically Erasable Programmable Read Only Memory (EEPROM), an Erasable Programmable Read Only Memory (EPROM), a Programmable Read Only Memory (PROM), a Read Only Memory (ROM), a magnetic memory, a flash memory, a magnetic disk or a compact disk.

The power component 806 may provide power to various components of the terminal device. The power component 806 may include a power management system, one or more power sources, and any other components associated with the generation, management and distribution of power in the terminal device.

The multimedia component 808 may include a display screen providing an output interface between the terminal device and a user. In some examples, the display screen may include a Liquid Crystal Display (LCD) and a Touch Panel (TP). If the display screen includes the TP, the display screen may be implemented as a touch screen to receive an input signal from the user. The TP includes one or more touch sensors to sense touch, swipe, and gestures on the TP. The touch sensors may not only sense a boundary of a touch or swipe action, but also detect a time of duration and a pressure associated with the touch or swipe action. In some examples, the multimedia component 808 includes a front camera and/or a rear camera. The front camera and/or the rear camera may receive external multimedia data while the terminal device is in an operation mode, such as a photographing mode or a video mode. Each front camera and each rear camera may be fixed optical lens systems or may have focal lengths and optical zoom capabilities.

The audio component 810 is configured to output and/or input audio signals. For example, the audio component 810 includes a Microphone (MIC) configured to receive external audio signals when the terminal device is in an operation mode, such as a call mode, a recording mode, and a voice recognition mode. The received audio signals may be further stored in the memory 804 or sent via the communication component 816. In some examples, the audio component 810 further includes a speaker configured to output audio signals.

The I/O interface 812 may provide an interface between the processing component 802 and peripheral interface modules, such as a keyboard, a click wheel, or buttons. These buttons may include, but not limited to: a home button, a volume button, a start button, and a lock button.

The sensor component 814 may include one or more sensors to provide status assessments of various aspects of the terminal device. For example, the sensor component 814 may detect an open/closed status of the terminal device, and relative positioning of components. For example, the component is the display and the keypad of the terminal device. The sensor component 814 may also detect a change in position of the terminal device or a component of the terminal device, a presence or absence of user contact with the terminal device, an orientation or an acceleration/deceleration of the terminal device, and a change in temperature of the terminal device. The sensor component 814 may include a proximity sensor configured to detect the existence of nearby objects under the situation of no physical contact. The sensor component 814 may also include an optical sensor, such as a CMOS or CCD image sensor, for use in imaging application. In some examples, the sensor component 814 may further include an accelerometer sensor, a gyroscope sensor, a magnetic sensor, a pressure sensor, or a temperature sensor.

The communication component 816 is configured to facilitate wired or wirelessly communication between the terminal device and other devices. The terminal device may access a wireless network based on a communication standard, such as WiFi, 2G or 3G, or a combination thereof. In an example of the present disclosure, the communication component 816 may receive broadcast signals or broadcast related information from an external broadcast management system via a broadcast channel. In an example, the communication component 816 may further include a Near Field Communication (NFC) module to facilitate short-range communications. For example, the NFC module may be implemented based on a Radio Frequency Identification (RFID) technology, an Infrared Data Association (IrDA) technology, an Ultra-Wide Band (UWB) technology, a Bluetooth (BT) technology and other technologies.

In some examples of the present disclosure, the terminal device may be implemented with one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors, or other electronic elements, for performing the above described methods.

Other examples of the disclosure will be apparent to those skilled in the art from consideration of the specification and practice of the disclosure herein. The disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the disclosure being indicated by the following claims.

It will be appreciated that the disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A terminal device, comprising:
a housing;
a display screen disposed on the housing;
a piezoelectric body, parallel to the display screen and comprising a fixed end and a free end, wherein the fixed end is fixedly connected to the housing, and the free end is opposite to the fixed end and is configured to vibrate under driving of an audio signal; and
a vibrating body, disposed between the display screen and the piezoelectric body, fixedly connected with the free end, comprising a first vibrating element and a second vibrating element, and configured to vibrate in a direction perpendicular to the display screen with vibration of the free end, wherein the first vibrating element is disposed between the display screen and the piezoelectric body and fixedly connected with the display screen, and the second vibrating element is disposed between the first vibrating element and the piezoelectric body and fixedly connected with the first vibrating element and the free end.

2. The terminal device of claim 1, wherein the second vibrating element is configured to convert the vibration of the free end to a second vibration in a direction perpendicular to the display screen, and the first vibrating element is configured to conduct the second vibration from the second vibrating element to the display screen.

3. The terminal device of claim 1, wherein the first vibrating element is disposed in a first center region of the display screen; and
the second vibrating element is disposed in a second center region of the first vibrating element.

4. The terminal device of claim 1, wherein a cross-sectional area of the first vibrating element is larger than a cross-sectional area of the second vibrating element.

5. The terminal device of claim 1, wherein the first vibrating element is of sheet-shaped, and the second vibrating element is of cylinder-shaped.

6. The terminal device of claim 1, wherein the first vibrating element comprises sheet steel.

7. The terminal device of claim 1, wherein a thickness of the first vibrating element is between 0.1 mm and 0.3 mm.

8. The terminal device of claim 1, wherein the housing comprises a middle frame.

9. The terminal device of claim 8, wherein the housing comprises a gap between the free end and the middle frame.

10. The terminal device of claim 9, wherein the fixed end is fixedly connected on the middle frame.

11. The terminal device of claim 10, wherein the middle frame comprises a groove, and the groove opens towards a direction that is parallel to the display screen installed; and the fixed end is disposed in the groove.

12. The terminal device of claim 8, wherein the housing comprises a gap between the vibrating body and the middle frame.

13. An audio output device, comprising:
a middle frame;
a panel disposed on the middle frame;
a piezoelectric body, parallel to the panel and comprising a fixed end and a free end, wherein the fixed end is fixedly connected to the middle frame, and the free end is opposite to the fixed end and is configured to vibrate under driving of an audio signal; and
a vibrating body, disposed between the panel and the piezoelectric body, fixedly connected with the free end, comprising a first vibrating element and a second vibrating element, and configured to vibrate in a direction perpendicular to the panel with vibration of the free end, wherein the first vibrating element is disposed between the panel and the piezoelectric body and fixedly connected with the panel, and the second vibrating element is disposed between the first vibrating element and the piezoelectric body and fixedly connected with the first vibrating element and the free end.

14. The audio output device of claim 13,
wherein the second vibrating element is configured to convert the vibration of the free end to a second vibration in a direction perpendicular to the panel, and the first vibrating element is configured to conduct the second vibration from the second vibrating element to the panel.

15. The audio output device of claim 13, wherein the first vibrating element is disposed in a first center region of the panel; and
the second vibrating element is disposed in a second center region of the first vibrating element.

16. The audio output device of claim 13, wherein a cross-sectional area of the first vibrating element is larger than a cross-sectional area of the second vibrating element.

17. The audio output device of claim 13, wherein the first vibrating element is of sheet-shaped, and the second vibrating element is of cylinder-shaped.

18. The audio output device of claim 13, wherein the first vibrating element comprises sheet steel.

19. The audio output device of claim 13, a thickness of the first vibrating element is between 0.1 mm and 0.3 mm.

* * * * *